United States Patent
Kuo et al.

(10) Patent No.: US 10,629,972 B2
(45) Date of Patent: Apr. 21, 2020

(54) RADIO-FREQUENCY SWITCHING CIRCUIT

(71) Applicant: PEGATRON CORPORATION, Taipei (TW)

(72) Inventors: Yu-Jeng Kuo, Taipei (TW); Wei-Chun Tsao, Taipei (TW); Chia-Hung Liu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 43 days.

(21) Appl. No.: 16/168,849

(22) Filed: Oct. 24, 2018

(65) Prior Publication Data
US 2019/0140332 A1 May 9, 2019

(30) Foreign Application Priority Data
Nov. 8, 2017 (TW) ............... 106138676 A

(51) Int. Cl.
| | |
|---|---|
| H01P 1/15 | (2006.01) |
| H01P 1/10 | (2006.01) |
| H03K 17/693 | (2006.01) |
| H03K 17/74 | (2006.01) |
| H01P 1/212 | (2006.01) |
| H04B 1/00 | (2006.01) |
| H04B 1/04 | (2006.01) |
| H04B 1/18 | (2006.01) |
| H04B 1/48 | (2006.01) |

(52) U.S. Cl.
CPC ............... *H01P 1/15* (2013.01); *H01P 1/212* (2013.01); *H03K 17/693* (2013.01); *H03K 17/74* (2013.01); *H04B 1/005* (2013.01); *H04B 1/0475* (2013.01); *H04B 1/18* (2013.01); *H04B 1/48* (2013.01)

(58) Field of Classification Search
CPC .................................... H01P 1/10; H01P 1/15
USPC ........................................ 333/101, 103, 104
See application file for complete search history.

(56) References Cited

U.S. PATENT DOCUMENTS

| | | |
|---|---|---|
| 3,475,700 A | 10/1969 | Ertel |
| 4,843,354 A | 6/1989 | Fuller et al. |

(Continued)

FOREIGN PATENT DOCUMENTS

| | | |
|---|---|---|
| CN | 1255836 A | 6/2000 |
| JP | H05-37318 A | 2/1993 |

(Continued)

*Primary Examiner* — Dean O Takaoka
(74) *Attorney, Agent, or Firm* — McClure, Qualey & Rodack, LLP

(57) ABSTRACT

A radio-frequency switching circuit includes a first diode, a second diode, a first inductor, a second inductor, a first capacitor, and a second capacitor. Cathodes of the first diode and the second diode are configured to receive a first reference voltage. A first inductor is coupled with an anode of the first diode, and configured to receive a first control voltage. A second inductor is coupled with an anode of the second diode, and configured to receive a second control voltage. The first capacitor is coupled with the first node of the first inductor. The second capacitor is coupled with the first node of the second inductor. When the first control voltage is lower than the first reference voltage, the first diode is switched off. When the second control voltage is lower than the first reference voltage, the second diode is switched off.

10 Claims, 4 Drawing Sheets

(56) References Cited

U.S. PATENT DOCUMENTS

| | | | | |
|---|---|---|---|---|
| 5,170,139 A | * | 12/1992 | Nelson | H01P 1/15 333/103 |
| 5,699,023 A | * | 12/1997 | Tanaka | H03K 17/76 333/103 |
| 5,914,544 A | * | 6/1999 | Tanaka | H01P 1/15 307/130 |
| 6,650,199 B2 | * | 11/2003 | Dobrovolny | H01P 1/15 333/103 |
| 7,129,805 B2 | * | 10/2006 | Marion | H01P 1/15 333/103 |
| 7,385,465 B2 | | 6/2008 | Chen | |
| 7,391,283 B2 | * | 6/2008 | Kearns | H01P 1/15 333/103 |
| 8,884,650 B2 | | 11/2014 | Miyazaki | |
| 2008/0305750 A1 | | 12/2008 | Alon et al. | |
| 2014/0078914 A1 | | 3/2014 | Shor et al. | |
| 2015/0303977 A1 | | 10/2015 | Puente et al. | |

FOREIGN PATENT DOCUMENTS

| | | |
|---|---|---|
| JP | H10-308602 A | 11/1998 |
| JP | 2004350144 A | 12/2004 |
| JP | 3809533 B2 | 6/2006 |
| JP | 2012114729 A | 6/2012 |

* cited by examiner

RADIO-FREQUENCY SWITCHING CIRCUIT

CROSS-REFERENCE TO RELATED APPLICATION

This application claims priority to Taiwan Application Serial Number 106138676, filed Nov. 8, 2017, which is herein incorporated by reference in its entirety.

BACKGROUND

Technology Field

The present disclosure relates to a switching circuit. More particularly, the present disclosure relates to a radio-frequency switching circuit capable of switching among radio frequency signals.

Description of Related Art

Radio-frequency switching chip are commonly used in the current communication circuit to enable the communication circuit to switch among radio frequency signals having different frequencies, and switch among the receiving and transmitting operations. However, current radio-frequency switching chips cannot suppress the magnitude of the harmonics generated by the internal components. In addition, radio-frequency switching chips fabricated by different vendors having different sizes, and thereby cannot be substituted for each other.

FIG. 1 is a simplified functional block diagram of a conventional radio-frequency switching chip 100. Radio-frequency switching chip 100 comprises a first switch 110, a second switch 120, a third switch 130, a fourth switch 140, a control circuit 150, an encapsulated package 160, a first signal pin RF1, a second signal pin RF2, and a common pin RFC. The radio-frequency switching chip 100 is capable of switching among the transmission paths of the radio frequency signal. For example, when the external voltage V1 having a high voltage level, the control circuit 150 may switch the first switch 110 and the fourth switch 140 to the conducted state, and switch the second switch 120 and the third switch 130 to the switched-off state. As a result, the radio frequency signal can only be transmitted between the first signal pin RF1 and the common pin RFC through the first switch 110. On the other hand, when the external voltage V1 having a low voltage level, the control circuit 150 may switch the first switch 110 and the fourth switch 140 to the switched-off state, and switch the second switch 120 and the third switch 130 to the conducted state. As a result, the radio frequency signal can only be transmitted between the second signal pin RF2 and the common pin RFC through the second switch 120.

By adapting the foregoing operations, the radio-frequency switching chip 100 is capable of switching among the transmission paths of the radio frequency signal. However, the size and shape of the radio-frequency switching chip 100, that are limited by the encapsulated package 160, are fixed. Therefore, the design of the peripheral circuits must be depended on the radio-frequency switching chip 100. Furthermore, the radio-frequency switching chip 100 cannot reduce the leakage currents of the switched-off first to fourth switches 110~140. Therefore, the radio-frequency switching chip 100 would generate harmonics having considerable magnitude.

SUMMARY

The disclosure provides a radio-frequency switching circuit. The radio-frequency switching circuit includes a first diode, a second diode, a first inductor, a second inductor, a first capacitor, and a second capacitor. A cathode of the first diode is configured to receive a first reference voltage. A cathode of the second diode is configured to receive the first reference voltage. A first node of the first inductor is coupled with an anode of the first diode, and a second node of the first inductor is configured to receive a first control voltage. A first node of the second inductor is coupled with an anode of the second diode, and a second node of the second inductor is configured to receive a second control voltage. The first capacitor is coupled with the first node of the first inductor. The second capacitor is coupled with the first node of the second inductor. When the first control voltage is lower than the first reference voltage, the first diode is switched off. When the second control voltage is lower than the first reference voltage, the second diode is switched off.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
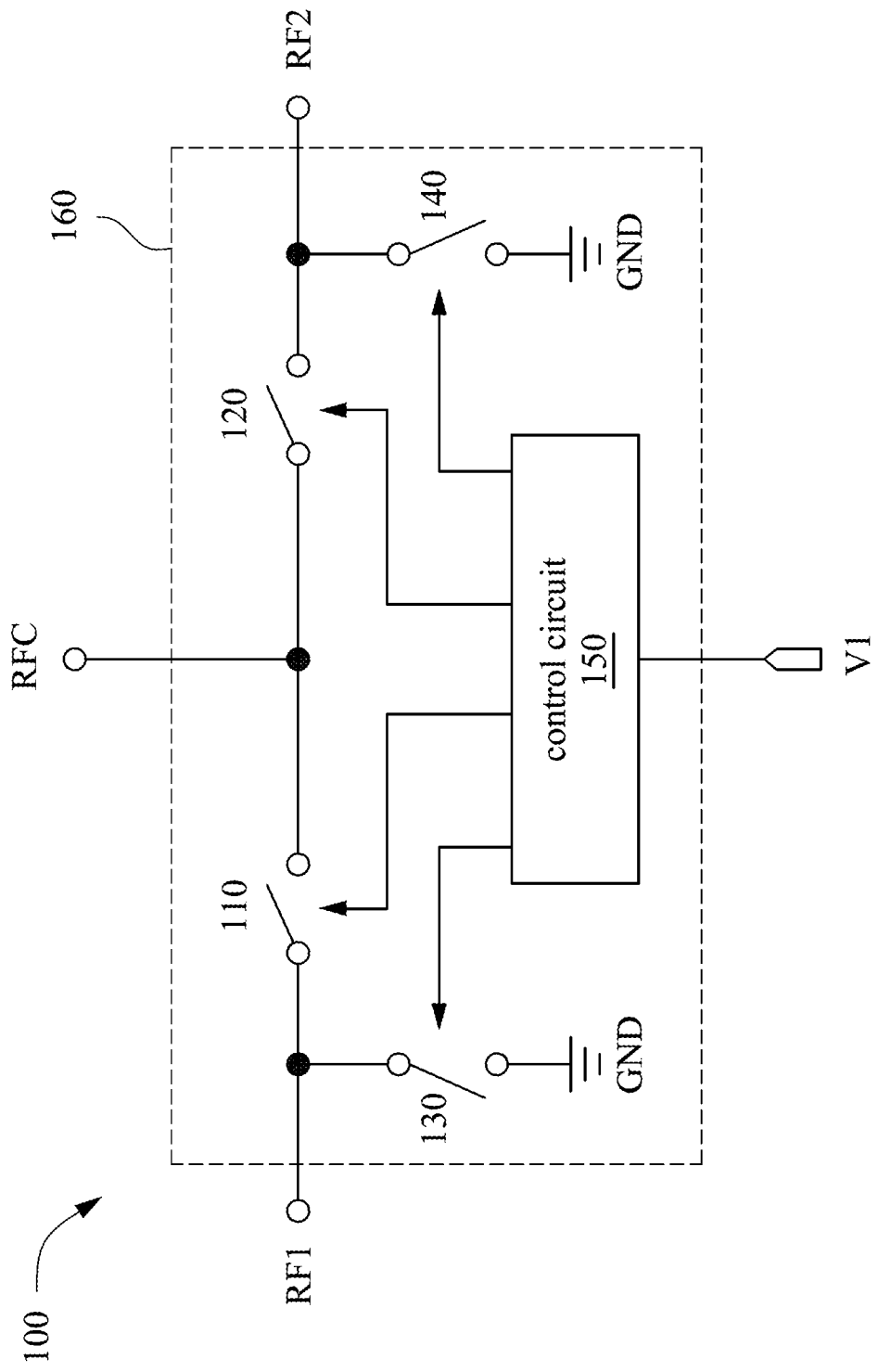
FIG. 1 is a simplified functional block diagram of a conventional radio-frequency switching chip.

Reference will now be made in detail to the present embodiments of the disclosure, examples of which are illustrated in the accompanying drawings. Wherever possible, the same reference numbers are used in the drawings and the description to refer to the same or like parts.

Figure 2:
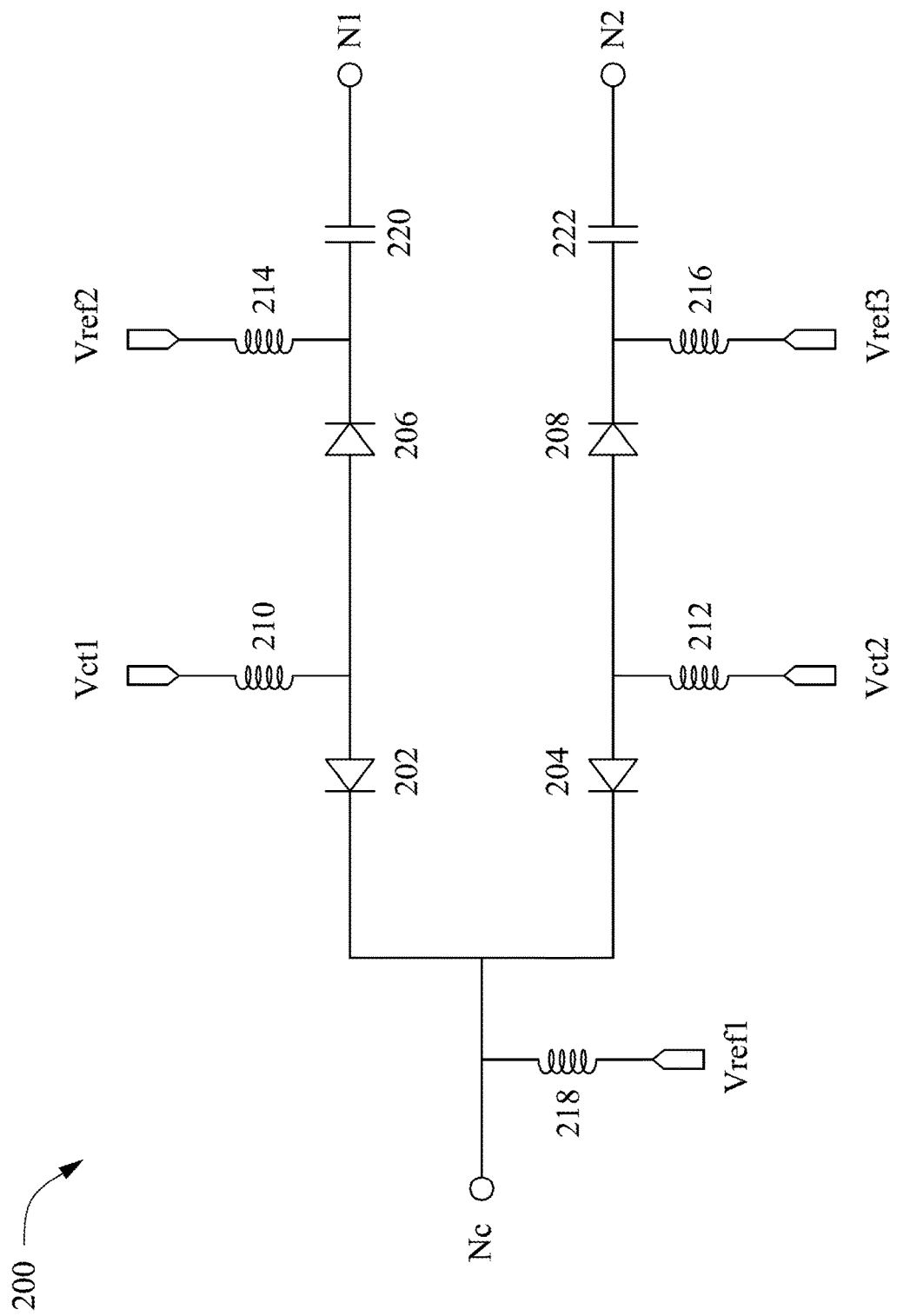
FIG. 2 is a simplified functional block diagram of a radio-frequency switching circuit according to one embodiment of the present disclosure.

The disclosure provides a radio-frequency switching circuit 200. FIG. 2 is a simplified functional block diagram of a radio-frequency switching circuit 200 according to one embodiment of the present disclosure. As shown in FIG. 2, the radio-frequency switching circuit 200 comprises a first diode 202, a second diode 204, a third diode 206, a fourth diode 208, a first inductor 210, a second inductor 212, a third inductor 214, a fourth inductor 216, a fifth inductor 218, a first capacitor 220, a second capacitor 222, a first signal node N1, a second signal node N2, and a common node Nc. For the sake of brevity, other functional blocks of the radio-frequency switching circuit 200 are not shown in FIG. 2.

A first node of the fifth inductor 218 is coupled with the cathode of the first diode 202 and the cathode of the second diode 204. A second node of the fifth inductor 218 is configured to receive a first reference voltage Vref1. Therefore, the cathode of the first diode 202 and the cathode of the second diode 204 may receive the first reference voltage Vref1 through the fifth inductor 218.

A first node of the first inductor 210 is coupled with the anode of the first diode 202 and the anode of the third diode 206. A second node of the first inductor 210 is configured to receive a first control voltage Vct1. Therefore, the anode of the first diode 202 and the anode of the third diode 206 may receive the first control voltage Vct1 through the first inductor 210.

A first node of the second inductor 212 is coupled with the anode of the second diode 204 and the anode of the fourth diode 208. A second node of the second inductor 212 is configured to receive a second control voltage Vct2. Therefore, the anode of the second diode 204 and the anode of the fourth diode 208 may receive the second control voltage Vct2 through the second inductor 212.

A first node of the third inductor 214 is coupled with the cathode of the third diode 206. A second node of the third inductor 214 is configured to receive a second reference voltage Vref2. Therefore, the cathode of the third diode 206 may receive the second reference voltage Vref2 through the third inductor 214.

A first node of the fourth inductor 216 is coupled with the cathode of the fourth diode 208. A second node of the fourth inductor 216 is configured to receive a third reference voltage Vref3. Therefore, the cathode of the fourth diode 208 may receive the third reference voltage Vref3 through the fourth inductor 216.

In addition, the first capacitor 220 is coupled between the first node of the third inductor 214 and the first signal node N1. The second capacitor 222 is coupled between the first node of the fourth inductor 216 and the second signal node N2. The common node Nc is coupled with the first node of the fifth inductor 218, wherein the first signal node N1, the second signal node N2, and the common node Nc are configured to receive the radio frequency signals.

Figure 3:
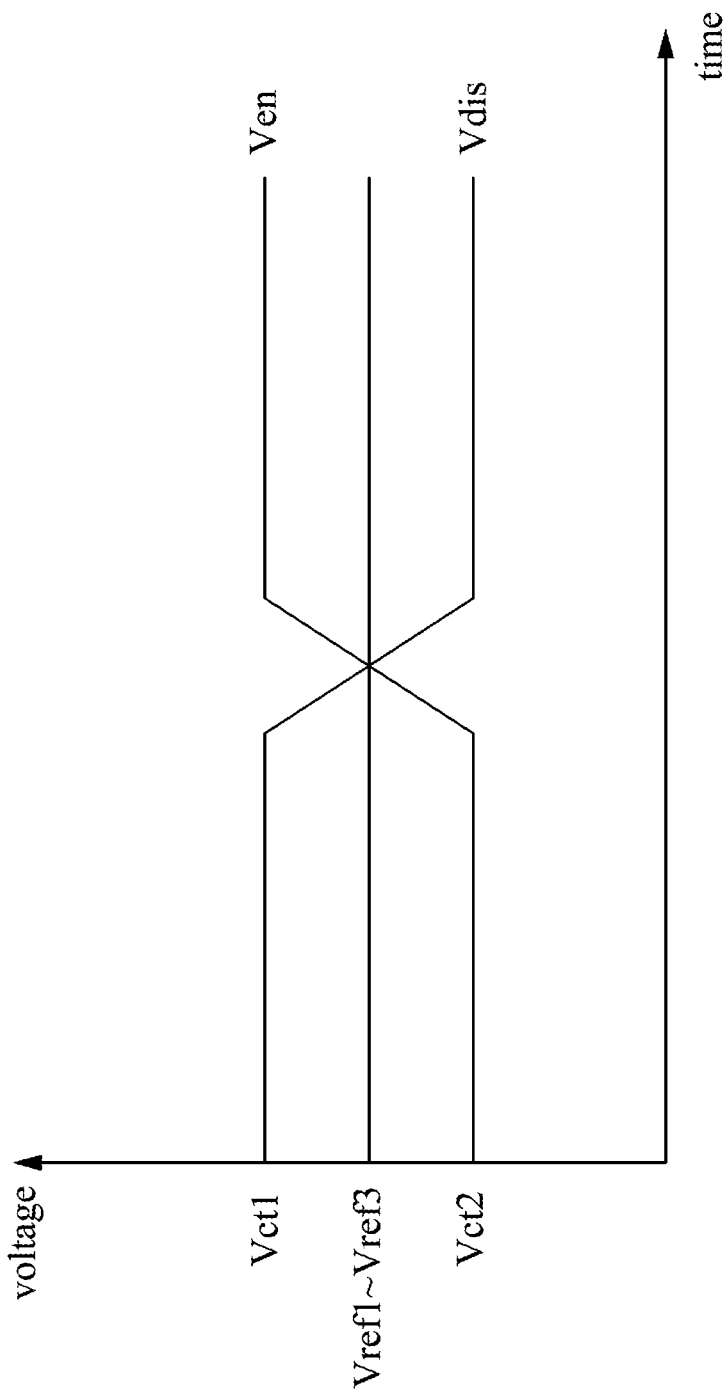
FIG. 3 is a simplified timing diagram illustrating the operations of the radio-frequency switching circuit of FIG. 2 according to one embodiment of the present disclosure.

FIG. 3 is a simplified timing diagram illustrating the operations of the radio-frequency switching circuit 200 of FIG. 2 according to one embodiment of the present disclosure. As shown in FIG. 3, the first control voltage Vct1 and the second control voltage Vct2 are voltage signals opposite to each other. Each of the first control voltage Vct1 and second control voltage Vct2 may be switched between an enable voltage level Ven (e.g., 5V) and a disabled voltage level Vdis (e.g., −5V). In other words, when the first control voltage Vct1 has the enable voltage level Ven, the second control voltage Vct2 would have the disabled voltage level Vdis, and so on.

The first reference voltage Vref1, the second reference voltage Vref2, and the third reference voltage Vref3 are fixed voltages having the same voltage level (e.g., 0V). The enable voltage level Ven is higher than the voltage levels of the first reference voltage Vref1, the second reference voltage Vref2, and the third reference voltage Vref3. On the other hand, the disabled voltage level Vdis is lower than the voltage levels of the first reference voltage Vref1, the second reference voltage Vref2, and the third reference voltage Vref3.

Please refer to FIGS. 2 and 3, when the voltage level of the first control voltage Vct1 is equal to the enable voltage level Ven, the first diode 202 and the third diode 206 would be forward biased. As a result, the first diode 202 and the third diode 206 are conducted. In this situation, a first signal path is formed between the first signal node N1 and the common node Nc. Specifically, the first inductor 210, the third inductor 214, and the fifth inductor 218 have low impedance for a direct signal transmitted on the first signal path, and have high impedance for an alternating radio frequency signal transmitted on the first signal path. The first capacitor 220 have high impedance for the direct signal transmitted on the first signal path, and have low impedance for the alternating radio frequency signal transmitted on the first signal path. Therefore, the direct signal may be transmitted in a circuit composed of the first inductor 210, the third inductor 214, the fifth inductor 218, the first diode 202, and the third diode 206. On the other hand, the alternating radio frequency signal may be transmitted on the first signal path composed of the first capacitor 220, the first signal node N1, and the common node Nc.

In this situation, the voltage level of the second control voltage Vct2 is equal to the disabled voltage level Vdis, so as to render the second diode 204 and the fourth diode 208 being reverse biased. Therefore, the second diode 204 and the fourth diode 208 are switched off. As a result, the radio frequency signal is isolated by the second diode 204 and the fourth diode 208, and thereby cannot be transmitted between the second signal node N2 and the common node Nc.

On the other hand, when the voltage level of the first control voltage Vct1 is equal to the disabled voltage level Vdis, the first diode 202 and the third diode 206 would be reverse biased. Therefore, the first diode 202 and the third diode 206 are switched off. As a result, the radio frequency signal is isolated by the first diode 202 and the third diode 206, and thereby cannot be transmitted between the first signal node N1 and the common node Nc.

In this situation, the voltage level of the second control voltage Vct2 are equal to the enable voltage level Ven, so as to render the second diode 204 and the fourth diode 208 being forward biased. Therefore, the second diode 204 and the fourth diode 208 are conducted. As a result, a second signal path is formed between the second signal node N2 and the common node Nc. Specifically, the second inductor 212, the fourth inductor 216, and the fifth inductor 218 have low impedance for the direct signal transmitted on the second signal path, and have high impedance for the alternating radio frequency signal transmitted on the second signal path. The second capacitor 222 has high impedance for the direct signal transmitted on the second signal path, and has low impedance for the alternating radio frequency signal transmitted on the second signal path. Therefore, the direct signal may be transmitted in a circuit composed of the second inductor 212, the fourth inductor 216, the fifth inductor 218, the second diode 204, and the fourth diode 208. The alternating radio frequency signal may be transmitted on the second signal path composed of the second capacitor 222, the second signal node N2, and the common node Nc.

In other words, when the first diode 202 or the third diode 206 is switched off, the first control voltage Vct1 is lower than the first reference voltage Vref1 and the second reference voltage Vref2. As a result, the leakage currents of the switched-off first diode 202 and third diode 206 may be reduced. When the second diode 204 or the fourth diode 208 is switched off, the second control voltage Vct2 is lower than the first reference voltage Vref1 and the third reference voltage Vref3. As a result, the leakage currents of the switched-off second diode 204 and fourth diode 208 may be reduced. By reducing the leakage currents of the switched-off first to fourth diodes 202~208, the radio-frequency switching circuit 200 can effectively suppress the magnitude of the harmonics caused by the leakage currents flowing through the diodes.

In practice, the first reference voltage Vref1, the second reference voltage Vref2, and the third reference voltage Vref3 may have different voltage levels.

In addition, the enable voltage level Ven for the first control voltage Vct1 and the enable voltage level Ven for the second control voltage Vct2 may be different. The disabled voltage level Vdis for the first control voltage Vct1 and the disabled voltage level Vdis for the second control voltage Vct2 may also be different.

Figure 4:
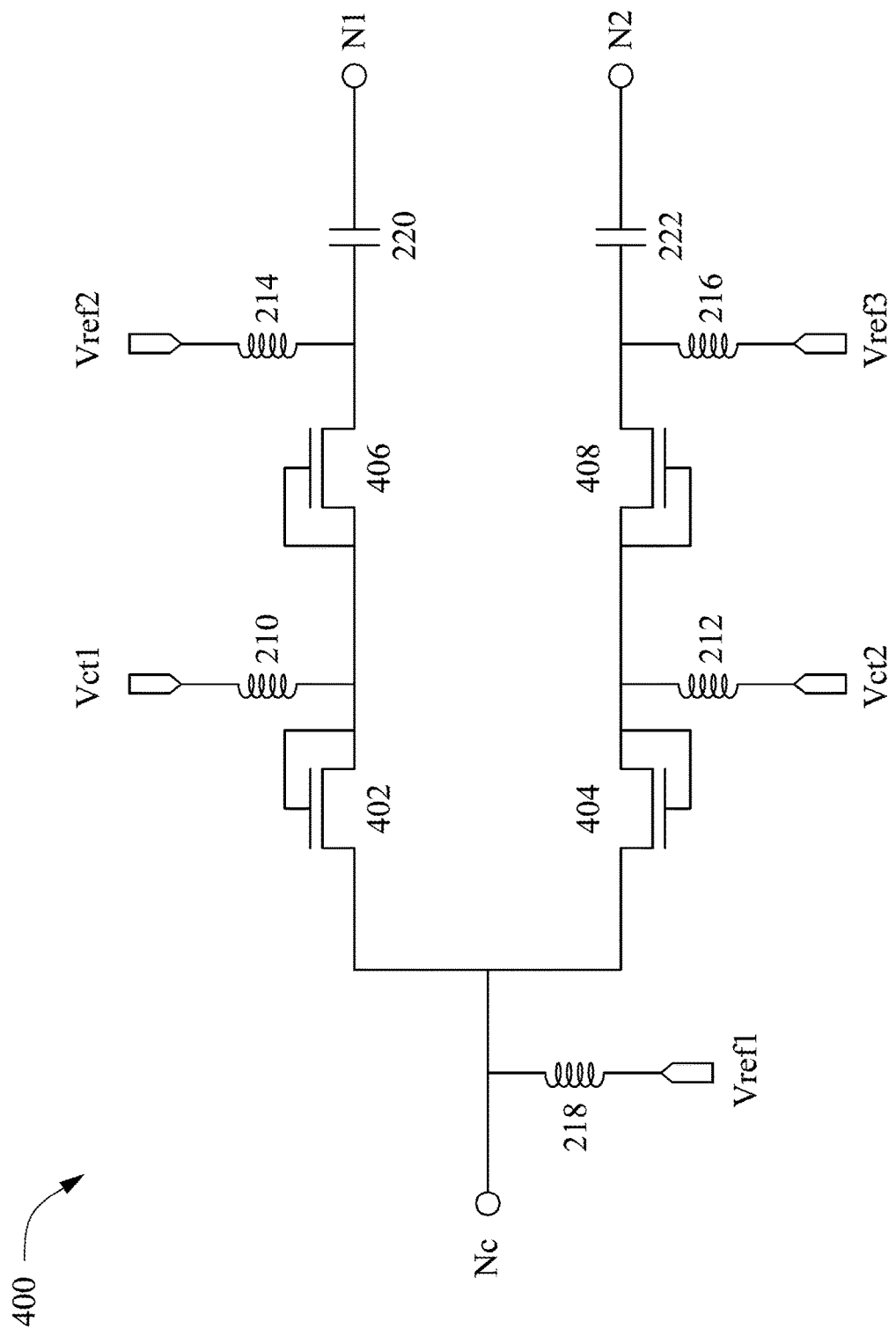
FIG. 4 is a simplified functional block diagram of a radio-frequency switching circuit according to another embodiment of the present disclosure.

In addition, in some embodiments that an additional harmonic filter is incorporated into the radio-frequency switching circuit 200 or the radio-frequency switching circuit 200 having higher tolerance to harmonics, the third diode 206, the fourth diode 208, the third inductor 214, and the fourth inductor 216 may be omitted. FIG. 4 is a simplified functional block diagram of a radio-frequency switching circuit 400 according to another embodiment of the present disclosure. As shown in FIG. 4, the radio-frequency switching circuit 400 is similar to the radio-frequency switching circuit 200. The different is that the radio-frequency switching circuit 400 comprises a first transistor 402, a second transistor 404, a third transistor 406, and a fourth transistor 408, rather than comprises the corresponding components of the radio-frequency switching circuit 200 such as the first diode 202, the second diode 204, the third diode 206, and the fourth diode 208. The first transistor 402, the second transistor 404, the third transistor 406, and the fourth transistor 408 are diode connected transistors. For the sake of brevity, other functional blocks of the radio-frequency switching circuit 400 are not shown in FIG. 4.

Specifically, the first node of the first inductor 210 is coupled with the drain and gate of the first transistor 402, and coupled with the drain and gate of the third transistor 406. The first node of the second inductor 212 is coupled with the drain and gate of the second transistor 404, and coupled with the drain and gate of the fourth transistor 408. The first node of the third inductor 214 is coupled between the source of the third transistor 406 and the first capacitor 220. The first node of the fourth inductor 216 is coupled between the source of the fourth transistor 408 and the second capacitor 222. The first node of the fifth inductor 218 is coupled with the source of the first transistor 402 and the source of the second transistor 404.

Since the first transistor 402, the second transistor 404, the third transistor 406, and the fourth transistor 408 are N-type transistors, the radio-frequency switching circuit 400 may operates according to the voltage waveforms of the aforesaid FIG. 3. When the voltage level of the first control voltage Vct1 is equal to the enable voltage level Ven, the first transistor 402 and the third transistor 406 would be conducted. In this situation, a third signal path is formed between the first signal node N1 and the common node Nc. The third signal path has low impedance for the alternating signal, has high impedance for the direct signal, and thereby is similar to an opened circuit for the direct signal. As a result, the alternating radio frequency signals may be transmitted on the third signal path composed of the first capacitor 220, first signal node N1, and common node Nc.

In this situation, the voltage level of the second control voltage Vct2 is equal to the disabled voltage level Vdis, so as to render the second transistor 404 and the fourth transistor 408 being switched-off. Therefore, the radio frequency signal would be isolated by the second transistor 404 and the fourth transistor 408, and cannot be transmitted between the second signal node N2 and the common node Nc.

On the other hand, when the voltage level of the first control voltage Vct1 is equal to the disabled voltage level Vdis, the first transistor 402 and the third transistor 406 would be switched off. Therefore, the radio frequency signal is isolated by the first transistor 402 and the third transistor 406, and cannot be transmitted between the first signal node N1 and the common node Nc.

In this situation, the voltage level of the second control voltage Vct2 is equal to the enable voltage level Ven, so as to render the second transistor 404 and the fourth transistor 408 being conducted. Accordingly, a fourth signal path is formed between the second signal node N2 and the common node Nc. The fourth signal path has low impedance for the alternating signal, has high impedance for the direct signal, and thereby is similar to an opened circuit for the direct signal. As a result, the alternating radio frequency signal may be transmitted on the fourth signal path composed of the second capacitor 222, the second signal node N2, and the common node Nc.

The foregoing descriptions regarding the implementations, connections, operations, and related advantages of other corresponding functional blocks in the radio-frequency switching circuit 200 are also applicable to the radio-frequency switching circuit 400. For the sake of brevity, those descriptions will not be repeated here.

In one embodiment, the first diode 202, the second diode 204, the third diode 206, and the fourth diode 208 of the radio-frequency switching circuit 200 may be replaced by P-type transistors.

For example, in some embodiments, the radio-frequency switching circuit comprises four P-type transistors. Each of the two of the four P-type transistors has a drain and gate that are coupled with the first node of the fifth inductor 218. Another P-type transistor has a drain and gate that are coupled with the first node of the third inductor 214. The other P-type transistor has a drain and gate that are coupled with the first node of the fourth inductor 216.

As can be appreciated from the foregoing descriptions, the radio-frequency switching circuits 200 and 400 can reduce the leakage currents of the switched-off signal path, and thereby can reduce the magnitude of the harmonics caused by the leakage currents flowing through the diodes or transistors.

In addition, the radio-frequency switching circuits 200 and 400 need not to comprise an integrated circuit having an encapsulated package. Therefore, all of the components of the radio-frequency switching circuits 200 and 400 can be configured on the circuit board with high flexibility, so as to render the radio-frequency switching circuits 200 and 400 having high application flexibility.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "voltage signal" used throughout the description and the claims may be expressed in the format of a current in implementations, and the term "current signal" used throughout the description and the claims may be expressed in the format of a voltage in implementations.

In addition, the singular forms "a," "an," and "the" herein are intended to comprise the plural forms as well, unless the context clearly indicates otherwise.

Other embodiments of the disclosure will be apparent to those skilled in the art from consideration of the specification and practice of the disclosure disclosed herein. It is intended that the specification and examples be considered as exemplary only, with a true scope and spirit of the disclosure indicated by the following claims.

What is claimed is:

1. A radio-frequency switching circuit, comprising:
   a first diode, wherein a cathode of the first diode is configured to receive a first reference voltage;
   a second diode, wherein a cathode of the second diode is configured to receive the first reference voltage;
   a first inductor, wherein a first node of the first inductor is coupled with an anode of the first diode, and a second node of the first inductor is configured to receive a first control voltage;
   a second inductor, wherein a first node of the second inductor is coupled with an anode of the second diode, and a second node of the second inductor is configured to receive a second control voltage;
   a first capacitor, coupled with the first node of the first inductor; and
   a second capacitor, coupled with the first node of the second inductor;
   wherein when the first control voltage is lower than the first reference voltage, the first diode is switched off, and when the second control voltage is lower than the first reference voltage, the second diode is switched off.

2. The radio-frequency switching circuit of claim 1, further comprising:
   a third diode, wherein an anode of the third diode is coupled with the first node of the first inductor;
   a fourth diode, wherein an anode of the fourth diode is coupled with the first node of the second inductor;
   a third inductor, wherein a first node of the third inductor is coupled between a cathode of the third diode and the first capacitor, and a second node of the third inductor is configured to receive a second reference voltage;
   a fourth inductor, wherein a first node of the fourth inductor is coupled between a cathode of the fourth diode and the second capacitor, and a second node of the fourth inductor is configured to receive a third reference voltage; and
   a fifth inductor, wherein a first node of the fifth inductor is coupled with the cathode of the first diode and the cathode of the second diode, and a second node of the fifth inductor is configured to receive the first reference voltage.

3. The radio-frequency switching circuit of claim 2, wherein when the third diode is switched off, the first control voltage is lower than the second reference voltage, and when the fourth diode is switched off, the second control voltage is lower than the third reference voltage.

4. The radio-frequency switching circuit of claim 3, wherein when the first diode or the third diode is switched off, the first control voltage is lower than the first reference voltage and the second reference voltage, and when the second diode or the fourth diode is switched off, the second control voltage is lower than the first reference voltage and the third reference voltage.

5. The radio-frequency switching circuit of claim 2, wherein when the first diode and the third diode are conducted, the second diode and the fourth diode are switched off.

6. A radio-frequency switching circuit comprising:
   a first transistor, wherein a source of the first transistor is configured to receive a first reference voltage, and a drain of the first transistor is coupled with a gate of the first transistor;
   a second transistor, wherein a source of the second transistor is configured to receive the first reference voltage, and a drain of the second transistor is coupled with a gate of the second transistor;
   a first inductor, wherein a first node of the first inductor is coupled with the drain of the first transistor, and a second node of the first inductor is configured to receive a first control voltage;
   a second inductor, a first node of the second inductor is coupled with the drain of the second transistor, and a second node of the second inductor is configured to receive a second control voltage;
   a first capacitor, coupled with the first node of the first inductor; and
   a second capacitor, coupled with the first node of the second inductor;
   wherein when the first control voltage is lower than the first reference voltage, the first transistor is switched off, and when the second control voltage is lower than the first reference voltage, the second transistor is switched off.

7. The radio-frequency switching circuit of claim 6, further comprising:
   a third transistor, wherein a drain of the third transistor and a gate of the third transistor are coupled with the first node of the first inductor;
   a fourth transistor, wherein a drain of the fourth transistor and a gate of the fourth transistor are coupled with the first node of the second inductor;
   a third inductor, wherein a first node of the third inductor is coupled between a source of the third transistor and the first capacitor, and a second node of the third inductor is configured to receive a second reference voltage;
   a fourth inductor, wherein a first node of the fourth inductor is coupled between a source of the fourth transistor and the second capacitor, and a second node of the fourth inductor is configured to receive a third reference voltage; and
   a fifth inductor, wherein a first node of the fifth inductor is coupled with the source of the first transistor and the source of the second transistor, and a second node of the fifth inductor is configured to receive the first reference voltage.

8. The radio-frequency switching circuit of claim 7, wherein when the third transistor is switched off, the first control voltage is lower than the second reference voltage, and when the fourth transistor is switched off, the second control voltage is lower than the third reference voltage.

9. The radio-frequency switching circuit of claim 8, wherein when the first transistor or the third transistor is switched off, the first control voltage is lower than the first reference voltage and the second reference voltage, and when the second transistor or the fourth transistor is switched off, the second control voltage is lower than the first reference voltage and the third reference voltage.

10. The radio-frequency switching circuit of claim 7, wherein when the first transistor and the third transistor are conducted, the second transistor and the fourth transistor are switched off.

* * * * *